United States Patent [19]
Link

[11] Patent Number: 5,883,910
[45] Date of Patent: Mar. 16, 1999

[54] HIGH SPEED SEMICONDUCTOR LASER DRIVER CIRCUITS

[75] Inventor: Garry N. Link, Aloha, Oreg.

[73] Assignee: Maxim Integrated Products, Inc., Sunnyvale, Calif.

[21] Appl. No.: 888,026

[22] Filed: Jul. 3, 1997

[51] Int. Cl.$^6$ ....................................................... H01S 3/00
[52] U.S. Cl. ............................................. 372/38; 372/34
[58] Field of Search ................................. 372/26, 29, 34, 372/38

[56] References Cited

U.S. PATENT DOCUMENTS

| | | | |
|---|---|---|---|
| 4,709,370 | 11/1987 | Bednarz et al. | 372/38 |
| 5,563,898 | 10/1996 | Ikeuchi et al. | 372/38 |
| 5,734,668 | 3/1998 | Raven et al. | 372/38 |
| 5,736,844 | 4/1998 | Yanagisawa | 372/38 |
| 5,742,133 | 4/1998 | Wilhelm et al. | 372/38 |

OTHER PUBLICATIONS

"A Versatile Si–Bipolar Driver Circuit with High Output Voltage Swing for External and Direct Laser Modulation in 10 Gb/s Optical–Fiber Links", Rein et al., IEEE Journal of Solid–State Circuits, vol. 29, No. 9, Sep. 1994.

"A Speed, Power, and Supply Noise Evaluation of ECL Driver Circuits", Jouppi et al., IEEE Journal of Solid–State Circuits, vol. 31, No. 1, Jan. 1996.

Sony CXB1108AQ Laser Driver Data Sheet.

Sony CXB1118AQ/1128AQ Laser Driver Data Sheet.

Maxim MAX3261 Data Sheet, Rev. 3, Aug. 1996.

*Primary Examiner*—Hemang Sanghavi
*Attorney, Agent, or Firm*—Blakely, Sokoloff, Taylor & Zafman LLP

[57] ABSTRACT

A semiconductor laser driver circuit that provides single supply operation over a wide supply voltage range (e.g., 3 V to 5.5 V), is capable of high speed data transmission, and is programmable over a wide laser modulation current range (such as 5 mA to 60 mA). The circuit includes temperature sensitive circuits to adjust for changes in Vbe over the operating temperature range, and to adjust a bias current to maintain transistor $g_m$ in the presence of temperature changes. Also included is an adaptive drive feature to accommodate different laser drive currents. Details of these and other features are disclosed.

22 Claims, 6 Drawing Sheets

HIGH SPEED SEMICONDUCTOR LASER DRIVER CIRCUITS

BACKGROUND OF THE INVENTION

1. Field of the Invention

The present invention relates to the field of semiconductor laser driver circuits.

2. Prior Art

Existing high speed laser driver integrated circuits require a single power supply of approximately 5 V, or multiple power supplies. However, electronics systems are evolving toward lower supply voltages to conserve power and to exploit improving low voltage, high frequency IC processes. Therefore, it is an objective to provide a laser driver circuit capable of operating with a single supply voltage as low as 3 V. It is also an objective to provide operation with existing 5 V systems.

It is also an objective of the invention to comply with existing SDH/SONET specifications at 2.448 Gb/s, or faster.

It is also an objective of the invention to minimize power consumption.

It is also an objective of the invention to provide a wide range of laser modulation current (such as 5 mA to 60 mA) while meeting the previous objectives.

It is a further objective of the invention to be directly compatible with standard PECL logic at the data inputs.

FIG. 1 is a simplified schematic of a typical (Maxim MAX3261, Sony CXB1108AQ) integrated bipolar laser driver. The output transistors Q1 and Q2 switch the modulation current Imod into an external laser depending on the state of the differential data inputs Vin+, Vin−. RL represents the typical matching impedance of a high speed laser (e.g., 25 Ω). Emitter follower transistors Q3 and Q4 provide level shifting and current gain to drive the output transistors. Additional emitter followers can be included for more level shifting and current gain ("A Versatile Si-Bipolar Driver Circuit with High Output Voltage Swing for External and Direct Laser Modulation in 10 Gb/s Optical-Fiber Links", H.-M. Rein et al., IEEE Journal of Solid-State Circuits, Vol. 29, No. 9, September 1994). Differential pair Q5 and Q6 provides voltage gain to ensure full switching of the output devices by switching current I3 through R1 or R2 depending on the input data. The inputs can be buffered by optional emitter followers (not shown).

The circuit of FIG. 1 directly couples the output current from the collector of transistor Q1 to the laser. Since the supply voltage must be greater than the headroom needed by the current source Imod, plus the output transistor Q1, plus the laser, this topology is not capable of operation with a supply voltage of 3 V. For example, transistor Q1 and current source Imod both need about 1 V of headroom for high speed operation, the typical DC laser drop is 1.5 V, and a modulation current of 60 mA multiplied by the 25 Ωof RL is 1.5 V. This is a total of 5 V, which clearly shows that operation on a single 3 V DC supply is not possible.

The circuit of FIG. 2 can be used to AC couple the output current from the collector of transistor Q1 to a semiconductor laser. By using an inductor to set the DC voltage at the collector of Q1 to be equal to the supply, adequate headroom is achieved. The value of the inductor LAC is chosen to limit droop during long consecutive streams of data ones or zeros and the value of the capacitor CAC is chosen to provide the desired high pass cutoff frequency. The use of this output topology allows sufficient headroom for 3 V operation. This topology is commonly used in RF applications, and it has been previously applied to semiconductor lasers. Similar AC coupling networks with resistive pull-up have been previously implemented.

A disadvantage of the circuit of FIG. 1 is that the emitter follower currents I1 and I2 must be approximately equal to the peak base current (caused by collector to base capacitance) of the output transistors Q1 and Q2. At high data rates and with large modulation current, I1 and I2 can become very large (10's of mA). Transistors Q3 and Q4 must therefore be large devices and will also have significant transient base current. This sets a maximum value for R1 and R2 and can cause the value of current I3 to be larger than desired. The value of current I3 multiplied by R1 (or R2) results in the peak magnitude of the differential voltage signal across the bases of transistors Q1 and Q2. This signal must be large enough to fully switch the modulation current at its maximum value. The required amplitude is typically 400 mV for 60 mA of modulation current.

BRIEF SUMMARY OF THE INVENTION

A semiconductor laser driver circuit that provides single supply operation over a wide supply voltage range (e.g., 3 V to 5.5 V), is capable of high speed data transmission, and is programmable over a wide laser modulation current range (such as 5 mA to 60 mA) is disclosed. The circuit includes temperature sensitive circuits to adjust for changes in Vbe over the operating temperature range, and to adjust a bias current to maintain transistor $g_m$ in the presence of temperature changes. Also included is an adaptive drive feature to accommodate different laser drive currents.

Details of these and other features are disclosed.

DETAILED DESCRIPTION OF THE INVENTION

Figure 3:
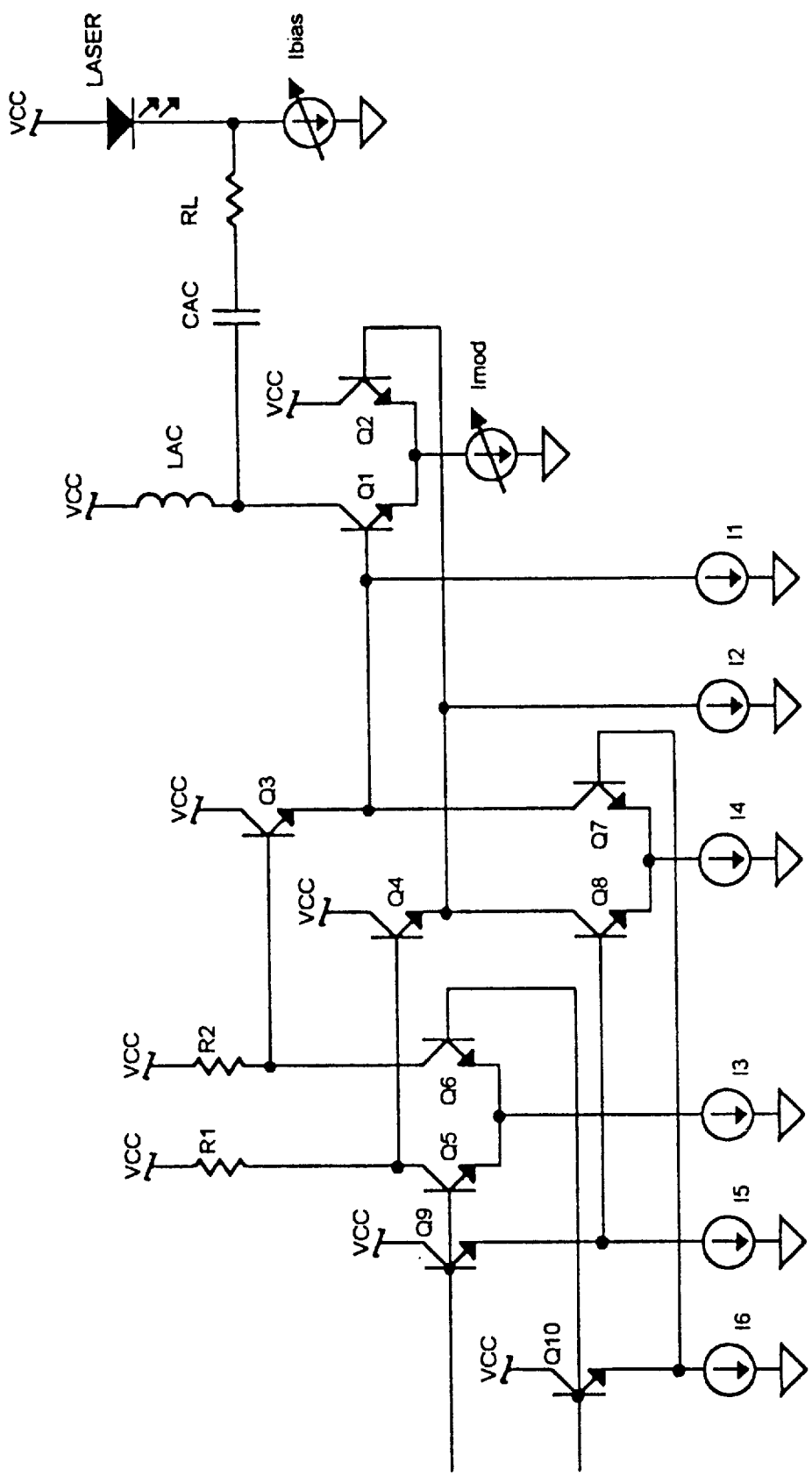
FIG. 3 is a circuit diagram for a first embodiment of the present invention having a switch driver with differential active pull-down.

First referring to FIG. 3, a first embodiment of the present invention may be seen. In this embodiment, the output transistors Q1 and Q2 are driven by two parallel circuits. One circuit pulls the base of the conducting output device high, and the other circuit pulls the base of the non-conducting output device low. The first circuit, comprised of differential pair Q5 and Q6, load resistors R1 and R2, emitter follower transistors Q3 and Q4, and current sources I1 and I2, is the identical topology as FIG. 1. The emitter of transistor Q3 or Q4, whichever is higher, pulls up on the base of the conducting output device. The additional second circuit is comprised of emitter followers Q9 and Q10, differential pair Q7 and Q8, and switched current source I4. (Additionally, current sources I5 and I6 are required to provide bias currents for transistors Q9 and Q10.) The collectors of transistors Q7 and Q8 are connected such that the current I4 is switched to the base of the non-conducting output device Q1 or Q2, thereby pulling it down.

Figure 1:
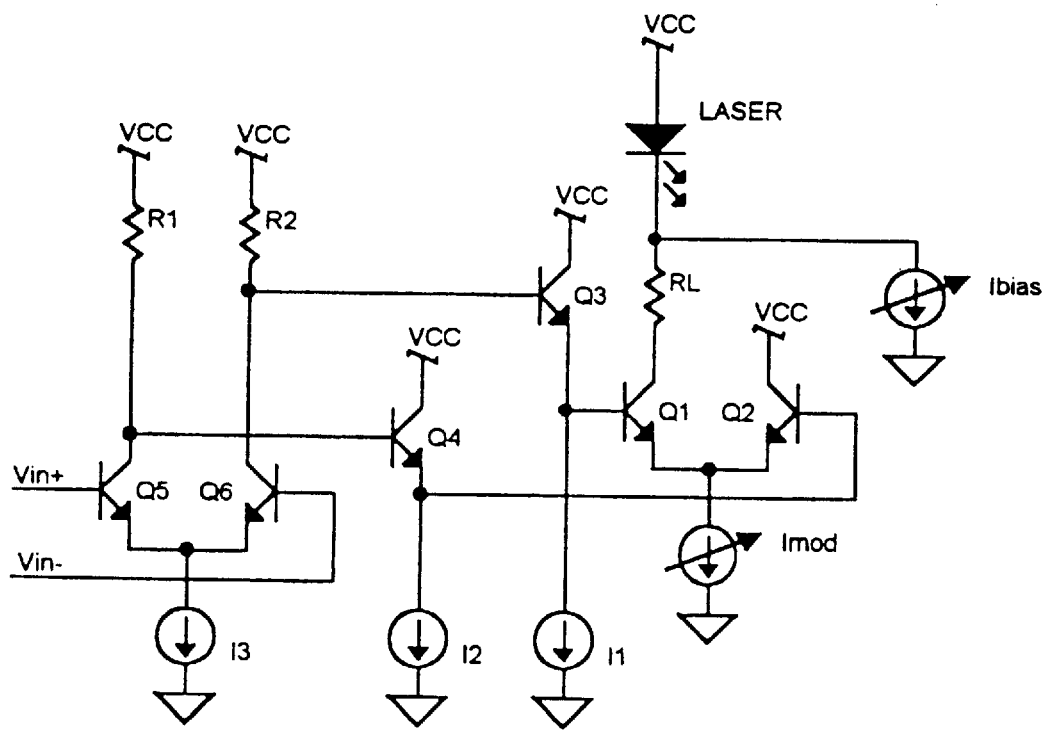
FIG. 1 is a simplified schematic of a typical prior art integrated bipolar laser driver.

The first advantage of the circuit of FIG. 3, when compared to the circuit of FIG. 1, is improved high frequency performance with lower power consumption. To understand the transient behavior of this circuit, assume that the differential data input signal is being switched from a logic zero to a logic one. In other words, the voltage at the base of transistor Q9 is moving higher and the voltage at the base of transistor Q10 is moving lower. The voltage at the collector of transistor Q5, which is connected to the base of transistor Q4, is moving lower because current source I3 is being switched through transistor Q5. Similarly, the voltage at the connection of the collector of transistor Q6 and the base of transistor Q3 is moving higher since I3 is being switched away from transistor Q6. The transient voltages at the emitters of transistors Q3 and Q4 are moving in the same direction as the voltages at the bases. Thus, the voltage at the emitter of transistor Q3 (base of transistor Q1) is rising, and the voltage at the emitter of transistor Q4 (base of transistor Q2) is falling. Because of stored base charge and junction capacitance, this differential voltage transient across the bases of large switching transistors Q1 and Q2 results in a surge of current into the base of transistor Q1 and a surge of current out of the base of transistor Q2. Emitter follower transistor Q3 can supply the current surge into the base of transistor Q1, but the current surge out of the base of transistor Q2 must be supplied by either current source I2 or the collector of transistor Q8. Remembering that the base of emitter follower transistor Q9 is moving higher and the base of emitter follower transistor Q10 is moving lower, the respective emitters will be moving in the same manner. Because of the circuit connections, the base of transistor Q8 is moving higher, and the base of transistor Q7 is moving lower. This action switches current source I4 through transistor Q8 (and away from transistor Q7) at the moment that it is most needed to supply the current surge coming from the base of transistor Q2. The end result is very fast switching of the modulation current Imod from transistor Q2 to transistor Q1. The output current from the collector of transistor Q1 flows through the coupling capacitor CAC and increases the laser current, signifying a transition from a logic zero to a logic one.

Because the dynamic nature of this circuit supplies transient current to the bases of transistors Q1 and Q2, constant current sources I1 and I2 can be significantly reduced, down to the small value required to prevent emitter followers Q3 and Q4 from turning off. Simulations have shown superior output transient current edge speeds when the total of current sources I1, I2 and I4 is less than half of the total current through I1 and I2 in FIG. 1.

Other advantages of the circuit in FIG. 3 are:

1. The propagation delay of the pull-up signal path consisting of differential pair Q5 and Q6 and emitter followers Q3 and Q4 is similar to the propagation delay of the pull-down signal path consisting of emitter followers Q9 and Q10 and differential pair Q7 and Q8. This delay match results in improved output current edge speed when compared to other active pull-down circuits.

2. Because of the switching action of transistors Q7 and Q8, the peak currents in the collectors and in the bases of emitter followers Q3 and Q4 are reduced. The reduced collector currents allows the use of smaller devices than Q3 and Q4 in FIG. 1, decreasing capacitive loading on sensitive high frequency nodes. The smaller transient base currents allow the use of larger values for R1 and R2, which in turn reduces the required value of I3, saving more power.

3. Because the value of I3 is also related to the current required in level shifting circuitry to be described below, the topology of FIG. 3 also results in reduced power (and device size) in the preceding stage.

Figure 2:
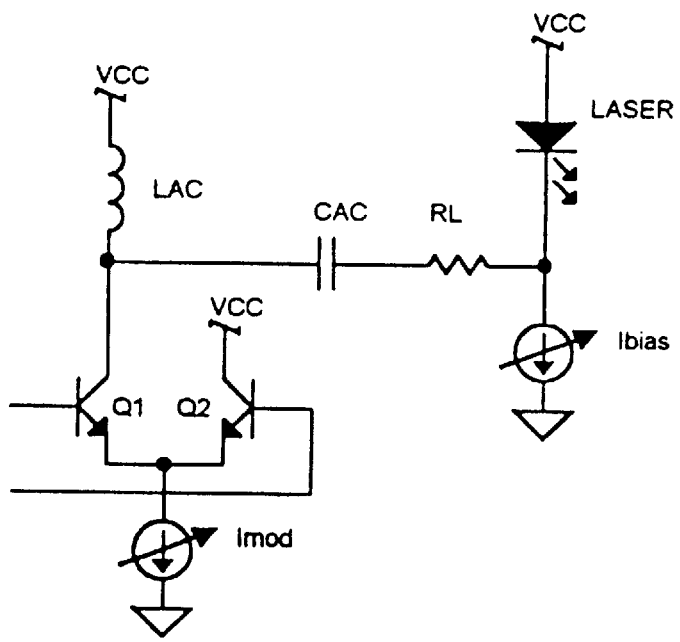
FIG. 2 is illustrates AC coupling of the output current to a semiconductor laser using an inductor to set the DC voltage at the collector of the laser drive transistor to be equal to the supply to achieve adequate headroom.

It is desirable for the bias voltages at the coupled emitters of transistors Q1 and Q2 to be maintained at a constant voltage of about 1 V. This value of 1 V, which results in a voltage of about 1.8 V at the bases of transistors Q1 and Q2, allows sufficient headroom for the AC coupled topology of FIG. 2 when using a 3 V supply, and allows the DC coupled topology of FIG. 1 for moderate modulation currents when using a 5 V nominal supply. Use of the DC coupled topology is desired when possible to eliminate the need for the inductive AC coupling network.

Figure 4:
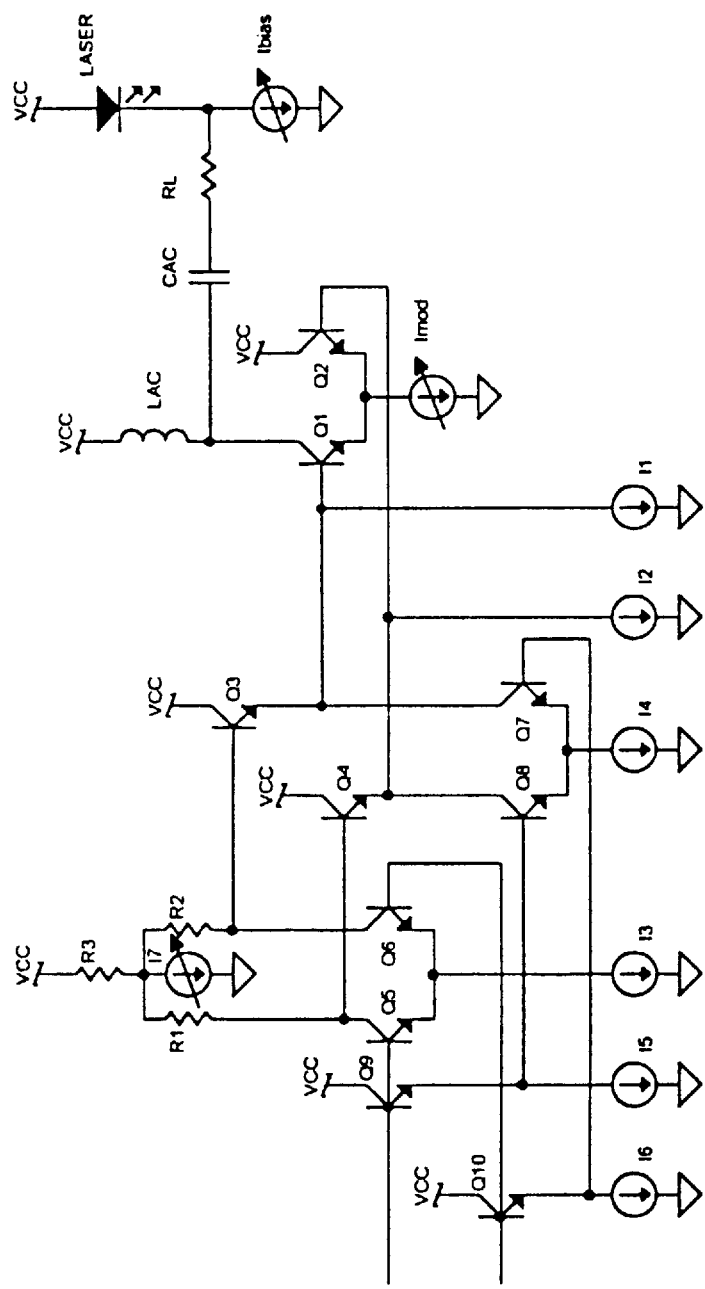
FIG. 4 is a circuit similar to the circuit of FIG. 3 and includes a resistive level shift R3 controlled by a supply and temperature dependent current source I7.

FIG. 4 shows a circuit topology with a resistive level shift R3 controlled by a supply and temperature dependent current source I7. A capacitor can be included across resistor R3 to minimize transient voltage variation at the connection of resistors R1, R2, R3 and current source I7.

The voltage across R3 is simply the value of resistor R3 multiplied by the sum of the currents I3 and I7. The optimum value of the current I7 is given by:

$$Vcc = (I3 + I7)R3 + 2Vbe + 1V, \text{ or}$$

$$I7 = \frac{Vcc - 2Vbe}{R3} - \left(\frac{1V}{R3} + I3\right) \tag{1}$$

where: VCC is the supply voltage, Vbe is the base to emitter voltage of a bipolar device on the process being used to implement the circuit, specifically the combination of devices Q3 and Q1, and devices Q4 and Q2, and the 1 V is the headroom for Imod.

It has been determined that it is advantageous to compensate for the base to emitter variation of the switching transistors Q1 and Q2 by setting the Vbe multiplier in the above equation to 2, as in equation (1). This extra temperature compensation (compared to only 1Vbe compensating for transistors Q3 and Q4) gives the maximum possible collector to base voltage on output transistors Q1 and Q2, and results in optimum high frequency performance.

Figure 7:
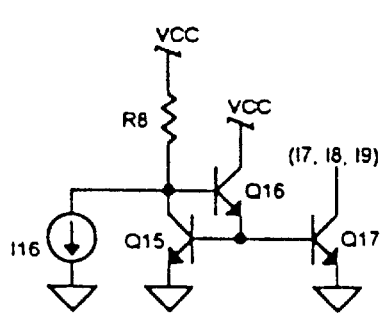
FIGS. 7 through 10 present circuits for providing bias currents with various characteristics for the circuit of FIG. 6.

A current source circuit resulting in the desired temperature and supply dependence of the current in accordance with equation (1) is presented in FIG. 7. In this circuit, neglecting base currents:

VCC=$I_{R8}$*R8+2Vbe (the Vbes of Q16 and Q17)

$I_{Q15}$=$I_{R8}$−I16

Substituting for $I_{R8}$, the foregoing equation can be rewritten as:

$$I_{Q15} = \frac{Vcc - 2Vbe}{R8} - I16 \tag{2}$$

with the current $I_{Q15}$ in transistor Q15 being mirrored to transistor Q17 to provide current I7 (or I8 or I9). Equation (2) can now be made identical to equation (1) with proper component value selection.

Figure 5:
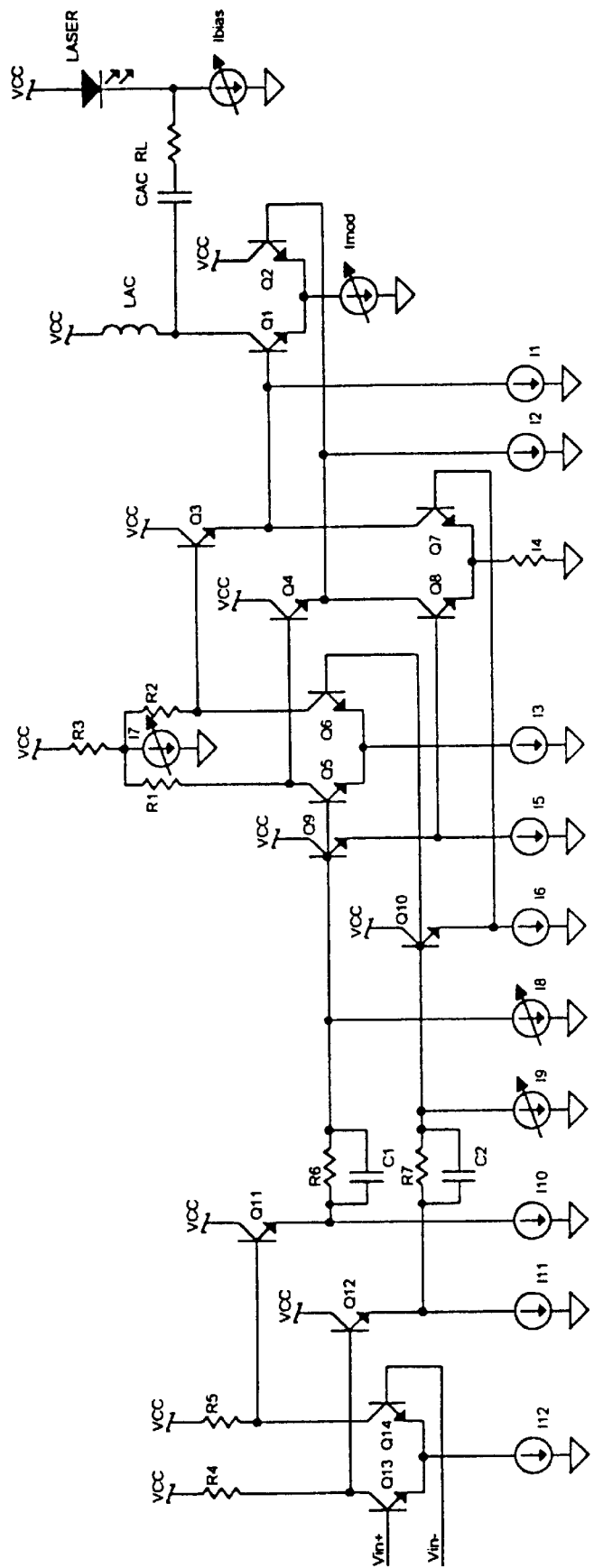
FIG. 5 is a circuit similar to the circuit of FIG. 4 and includes the addition of a level shifting input stage that is directly compatible with standard PECL logic.

Because of the addition of the resistive level shift in FIG. 4, the voltage at the collectors of transistors Q5 and Q6 remains at a nearly constant value with respect to ground at a given temperature regardless of supply voltage. Therefore, the stage that drives the circuit of FIG. 4 must also include a level shift to prevent transistors Q5 and Q6 from saturating over the supply voltage range. FIG. 5 shows a circuit containing the circuit of FIG. 4 and the addition of a level shifting input stage that is directly compatible with standard PECL logic.

The circuit of FIG. 5 contains input gain stage transistors Q13 and Q14 with current source I12 and load resistors R4 and R5. This stage is buffered by emitter followers Q11 and Q12 with bias current sources I10 and I11. The level shift is provided by current sources I8 and I9 through load resistors R6 and R7. Speed-up capacitors C1 and C2 are included to compensate for device and metal interconnect capacitance. Note that I4 has been replaced with a resistor because the additional voltage drop caused by transistors Q11 and Q12 reduces the headroom on I4 to a value lower than that required by a transistor current source. The current through I4 is set by the voltage at the emitters of transistors Q7 and Q8, which is related to the base to emitter voltages of switch transistors Q7 and Q8, emitter followers Q9 through Q12, and the level shift voltage across resistors R6 and R7. For optimum high frequency response, it is desired for the current of I4 to increase with temperature. This increasing current compensates for the decreasing transconductance ($g_m$) of transistors Q1 through Q4 and Q7 and Q8 in the final stage, resulting in nearly constant output current rise time over temperature. If the average voltage at the bases of transistors Q7 and Q8 is held at the silicon bandgap voltage (1.2 V) regardless of power supply or temperature, a commonly used analog design technique, the resulting current through the resistor providing the current I4 will be proportional to absolute temperature (PTAT). Since it is desired to maintain the average voltage at the bases of transistors Q7 and Q8 to 1.2 V (neglecting signal voltage swings), the required level shift currents are given by equation (3):

$$I8 = \frac{Vcc - 1.2V - 2Vbe}{R6} \quad (3)$$

where again: Vcc is the supply voltage, Vbe is the base to emitter voltage of a bipolar device on the process being used to implement the circuit, this time the combination of devices Q9 and Q11, and the 1.2 V is the silicon bandgap voltage (transistor Q8 in the specific path being considered).

Assuming balanced differential operation, R7 is equal to R6 and I9 is identical to I8. Since this equation is of the same general form as equation (1), the circuit of FIG. 7 will work for either case (current source I7, and current sources I8 and I9) with the appropriate choice of component values.

A major problem associated with the design of high speed semiconductor laser driver circuits is satisfying the need for a wide range of modulation current. Emerging laser technologies are achieving greater efficiencies resulting in smaller required modulation currents. However, existing devices require modulation currents of 60 mA or more. Because of the major investment required to develop production quality analog integrated circuits, it is highly desirable to provide a wide range of modulation current (5 mA to 60 mA) with a single integrated circuit. Unfortunately, it is difficult to provide such a wide current range with good high frequency signal response. The output device size must be large enough to reliably conduct the largest required modulation current. Large devices obviously will have higher junction and metal interconnect capacitance. The signal swing across the bases of the output transistors Q1 and Q2 must also be large enough to fully switch the output devices with the maximum modulation current. As mentioned above, this drive signal swing is on the order of about 400 mV per side with 60 mA of laser modulation current. If the modulation current is reduced by an order of magnitude without adjusting the switch transistor drive characteristics, excessive overshoot and ringing results on the output current waveform. These aberrations are a result of direct current injection through the collector to base capacitance of transistors Q1 and Q2 and indirect current injection caused by the capacitance of current source Imod. This second effect is caused by transient common mode voltage swings at the coupled emitter of transistors Q1 and Q2. It is therefore desirable to reduce the drive signal across the bases of transistors Q1 and Q2 when small modulation currents are being switched. This effect is reported in the paper by Rein et al., herein before referred to, after using an analog computer to optimize several current sources. The method in which an adaptive driver is implemented in this invention, however, is unique.

Figure 6:
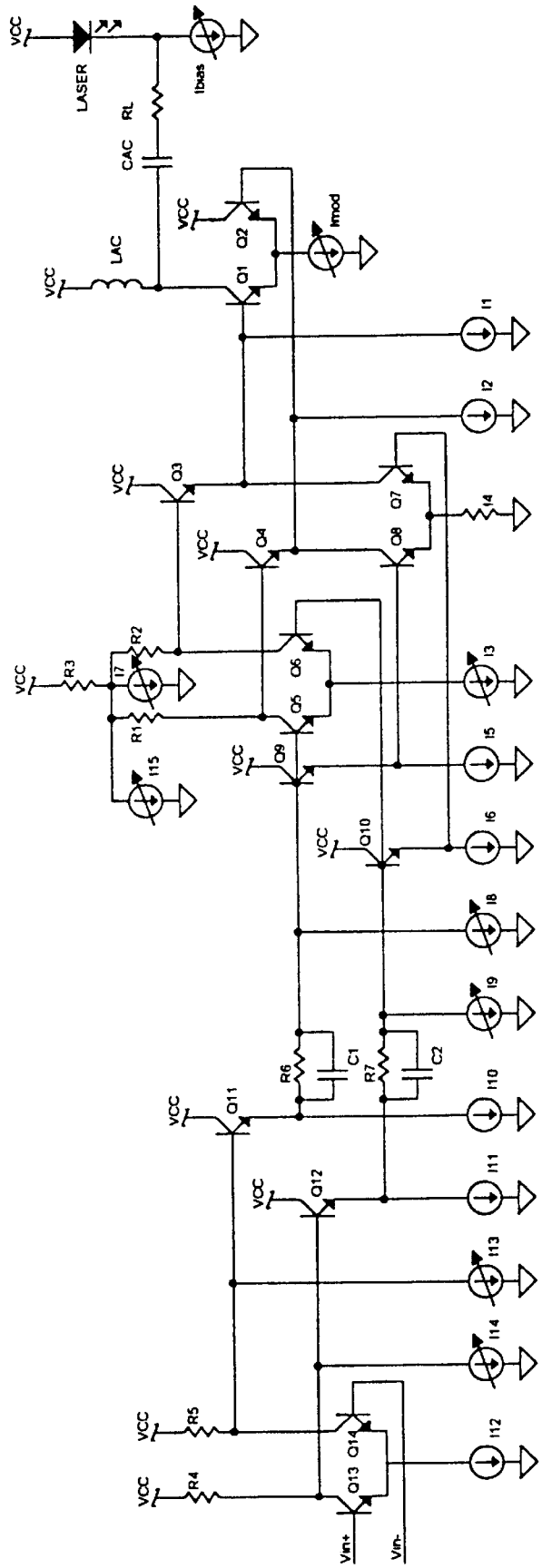
FIG. 6 is a circuit similar to the circuit of FIG. 4 and includes additional circuit components to implement an adaptive drive feature to accommodate different laser drive currents.

The circuit of FIG. 6 includes additional circuit components to implement the adaptive drive feature discussed above. First, it is desirable to reduce the voltage swing across the base of transistors Q1 and Q2 when using small modulation current. This can be accomplished by reducing the value of current source I3, as indicated by the variable current source I3 in FIG. 6. In order to preserve the level shift voltage across R3, an additional current source I15 must be introduced to counteract the DC effect of I3 across R3. In other words, I3 is reduced at low modulation current to reduce the signal amplitude across the collectors of transistors Q5 and Q6, and I15 is increased at low modulation currents to maintain the proper DC level shift across R3 in spite of the reduction in the current I3.

In addition to reducing the signal voltage across output transistors Q1 and Q2 at low modulation currents, it is advantageous to reduce the switched pull-down current available at the collectors of transistors Q7 and Q8. Because of the resistive current source I4, this adjustment must be accomplished indirectly. The additional current sources I13 and I14 in FIG. 6 have been included to accomplish the adjustment of the current source I4. By increasing the currents through I13 and I14 at low modulation currents, the common mode voltage at the bases of emitter followers Q11 and Q12 is reduced. This change of common mode voltage is transferred by emitter followers Q11 and Q12, level shift resistors R6, R7, and emitter followers Q9 and Q10 to the bases of transistors Q7 and Q8. The lower common mode voltage at the bases of transistors Q7 and Q8 in turn results in a lower voltage at the coupled emitters of transistors Q7 and Q8, which reduces the current through I4, as desired. In summary, currents I13 and I14 must increase at lower modulation current values to reduce the drive current switched by transistors Q7 and Q8.

Other methods could be used to attain the desired adjustment. For example, a current variation could be implemented as part of current sources I8 and I9, or I4 could be directly adjusted if the specific requirements allowed a transistor current source for I4. The method described above is preferred to minimize current source complexity because of the available headroom at the collectors of transistors Q13 and Q14.

Circuits to provide the required dependent current sources mentioned have been designed using common analog circuit design practices. FIG. 7 provides the desired supply and temperature dependence of equations (1), (2) and (3). The relative emitter area of transistors Q15 and Q17 and other component values can be adjusted to achieve DC current gain to minimize bias current power dissipation.

Figure 8:
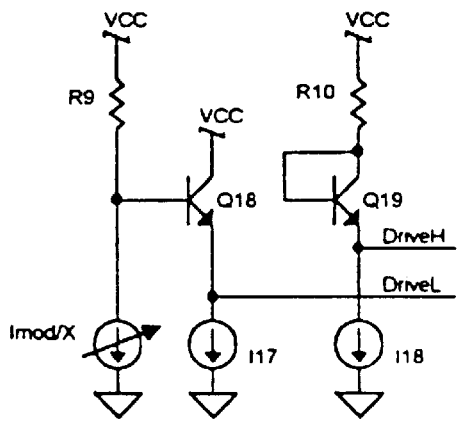
Figure 9:
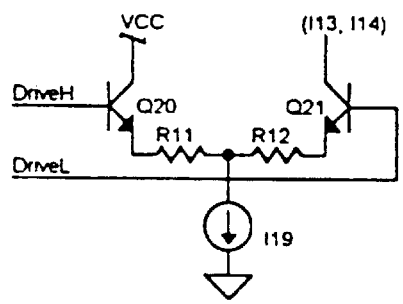
Figure 10:
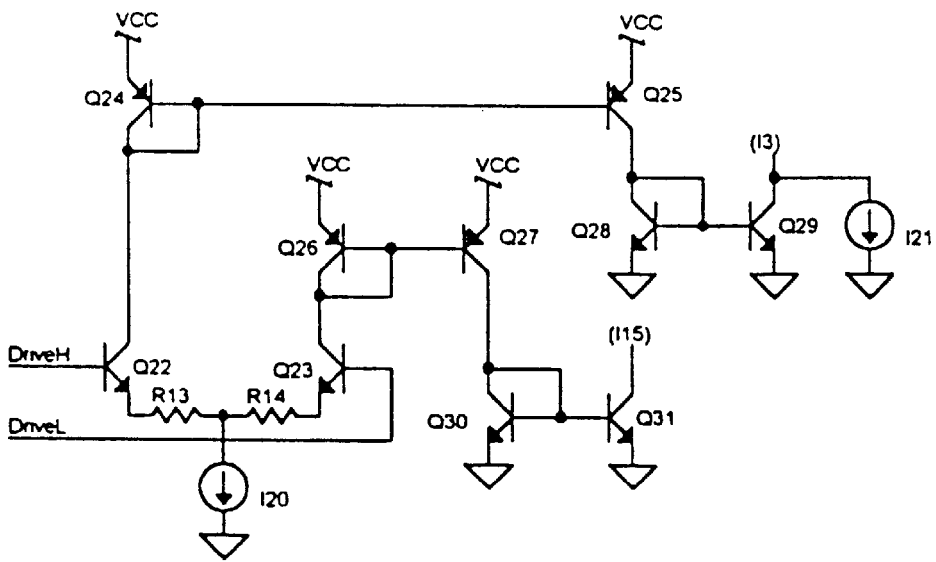

The circuit of FIG. 8 is used to generate a differential voltage that is proportional to modulation current for use in the circuits of FIG. 9 and FIG. 10. The voltage at node DriveH is VCC−I18*R10−Vbe and the voltage at DriveL is VCC−(Imod/X)*R9−Vbe. The differential voltage DriveH−DriveL is Imod/X*R9−(I18*R10), which is proportional to the modulation current Imod if X is a constant. The current source Imod/X can be easily implemented as a current mirror addition to transistor current source Imod.

FIG. 9 is used to derive the level shift currents I13 and I14. By including degeneration resistors R11 and R12 in the emitters of differential amplifier transistors Q20 and Q21, the current through transistor Q21 is inversely proportional to the differential "Drive" signal as desired. The current through transistor Q21 is equal to current source I19 at low modulation currents and zero at high modulation currents if the values of resistors R11 and R12 are selected properly. By way of example, if resistors R11 and R12 are equal, and DriveH exceeds DriveL by at least I19*R11, then all of the current I19 will flow through transistor Q20. Since DriveH−DriveL=Imod/X*R9−(I18*R10), this will occur when Imod/X*R9−(I18*R10)≧I19*R11, or Imod≧(X/R9) ((I19* R11)−(I18*R10)). When Imod is low, then DriveH−DriveL= Imod/X*R9−(I18*R10) will approach−(I18*R10), or DriveL will exceed DriveH by approximately (I18*R10). Now if (I18*R10)≧I19* R11, essentially all of the current I19 will flow through transistor Q20, as previously stated.

Similarly, FIG. 10 is used to generate the desired variation of current sources I3 and I15. The current through transistor Q22 increases with Imod and the current through transistor Q23 decreases with Imod because of the nature of the differential "Drive" signal. Because of the limited headroom in FIG. 6, current mirror transistors Q24 through Q31 are included to transfer the currents in transistors Q22 and Q23 to the collectors of transistors Q29 and Q31, respectively. The result is that the collector current of transistor Q29 is approximately proportional to Imod, and I15 at the collector of transistor Q31 is approximately inversely proportional to Imod, as desired. By properly choosing the values R13 and R14, the currents in the collectors of transistors Q29 and Q31 will vary between zero and the value of current source I20 over the full modulation current range. Constant current source I21 is included to set the minimum voltage swing across the collectors of transistors Q5 and Q6 in FIG. 6.

Several modifications to the circuit of FIG. 6 can be implemented without changing the spirit of the invention. These include:

1. Additional emitter followers can be added to buffer the PECL inputs.

2. If DC coupled operation at a 5 V nominal supply is not required, the level shifting circuitry of FIGS. 4 through 6 could be deleted. In this case, current source I4 could be a transistor current source and varied directly for adaptive drive.

3. Additional adaptive drive can be accomplished by directly varying current sources I1 and I2. However, since the topology allows for significant reduction in the value of these current sources, this is a minor improvement.

There has been described herein a new and unique semiconductor laser driver circuit that provides single supply operation over a wide supply voltage range, such as 3 V to 5.5 V, is capable of high speed data transmission, and is programmable over a wide laser modulation current range, such as 5 mA to 60 mA. While certain preferred embodiments have been described herein, it will be recognized by those skilled in the art that various changes in form and detail may be made therein without departing from the spirit and scope of the invention.

What is claimed is:

1. A circuit for providing a semiconductor laser drive current comprising:
   a laser drive circuit having first and second input lines forming a differential input for providing the laser drive current when the voltage on the first line is higher than the voltage on the second line and for not providing the laser drive current when the voltage on the second line is higher than the voltage on the first line; and,
   an active differential pull-up/pull-down circuit responsive to differential signals for actively pulling the voltage on the first input line of the laser drive circuit up and actively pulling the voltage on the second input line of the laser drive circuit down when the laser drive current is to be provided, and pulling the voltage on the first input line of the laser drive circuit down and pulling the voltage on the second input line of the laser drive circuit up when the laser drive current is not to be provided.

2. The laser drive circuit of claim 1 further comprised of first and second current sources coupled to the first and second input lines of the laser drive circuit, respectively.

3. The laser drive circuit of claim 1 wherein the laser drive circuit is an AC coupled circuit with inductive pull-up.

4. The laser drive circuit of claim 3 further comprised of a first level shift circuit coupled to the active differential pull-up/pull-down circuit to provide the differential signals thereto to allow operation of the laser drive circuit with a range of power supply voltages.

5. The laser drive circuit of claim 3 further comprised of a second level shift circuit coupled to the active differential pull-up/pull-down circuit to provide differential signals thereto having a different common mode voltage than differential input signals provided to the second level shift circuit.

6. In a semiconductor laser driver circuit, the improvement comprising:
   first and second power supply connections;
   first, second, third and fourth transistors, each having an emitter, a base and a collector;
   the first and second transistors having their emitters coupled together and through a first current source to the second power supply connection;
   the collector of the first transistor being coupled to a laser diode connection to provide laser drive current thereto, and the collector of the second transistor being coupled to the first power supply connection;
   the emitters of the third and fourth transistors being coupled to the second power supply connection;
   the collectors of the third and fourth transistors being coupled to the bases of the first and second transistors, respectively;
   the bases of the third an fourth transistors being coupled to receive a differential control voltage.

7. The improvement of claim 6 further comprised of an input circuit coupled to the bases of the first, second, third and fourth transistors to provide first and second control signals complimentary to third and fourth control signals, the first, second, third and fourth control signals being responsive to a differential input signal, the first and second control signals being coupled to the bases of the first and fourth transistors, respectively, and the third and fourth control signals being coupled to the bases of the second and third transistors, respectively.

8. The improvement of claim 6 wherein the emitters of the third and fourth transistors are coupled to the second power supply connection through a second current source.

9. The improvement of claim 6 further comprised of:

fifth and sixth transistors, each having an emitter, a base and a collector;

the collectors of the fifth and sixth transistors being coupled to the first power supply connection, the emitters of the fifth and sixth transistors being coupled to the collectors of the third and fourth transistors, respectively, and to the bases of first and second transistors, respectively; and, an input circuit coupled to the bases of the third, fourth, fifth and sixth transistors to provide first and second control signals complimentary to third and fourth control signals, the first, second, third and fourth control signals being responsive to a differential input signal, the first and second control signals being coupled to the bases of the fourth and fifth transistors, respectively, and the third and fourth control signals being coupled to the bases of the third and sixth transistors, respectively.

10. The improvement of claim 9 further comprised of second and third current sources coupled to the emitters of the fifth and sixth transistors, respectively.

11. The improvement of claim 9 further comprising a biasing circuit maintaining the voltage of the emitters of the first and second transistors relative to the voltage of the second power supply connection substantially independent of temperature variations.

12. The improvement of claim 11 wherein the emitters of the third and fourth transistors are coupled to the second power supply connection through a second current source.

13. The improvement of claim 6 further comprising fifth, sixth, seventh and eighth transistors, each having an emitter, a base and a collector;

the emitters of the third and fourth transistors being coupled to the second power supply connection through a second current source;

the collectors of the fifth and sixth transistors being coupled to the first power supply connection, the emitters of the fifth and sixth transistors being coupled to the collectors of the third and fourth transistors, respectively, and to the bases of first and second transistors, respectively;

the emitters of the seventh and eighth transistors being coupled together and through a third current source to the second power supply terminal;

the collectors of the seventh and eighth transistors being coupled to the bases of the fifth and sixth transistors, respectively, and through first and second resistors to a common node, the common node being coupled to the first power supply connection through a third resistor a fourth current source coupled between the common node and the second power supply connection; and, an input circuit coupled to the bases of the third, fourth, seventh and eighth transistors to provide first and second complimentary control signals, the first and second control signals being responsive to a differential input signal, the first control signal being coupled to the bases of the fourth and eighth transistors, respectively, and the second control signal being coupled to the bases of the third and seventh transistors, respectively.

14. The improvement of claim 13 wherein the second current source is a fourth resistor.

15. The improvement of claim 14 wherein the input circuit comprises a circuit for maintaining the average voltage of the bases of the third and fourth transistors substantially at the bandgap voltage of the transistors relative to the voltage of the second power supply connection.

16. The improvement of claim 15 further comprising a biasing circuit maintaining the voltage of the emitters of the first and second transistors relative to the voltage of the second power supply connection substantially independent of temperature variations.

17. The improvement of claim 13 further comprising:

ninth and tenth transistors, each having an emitter, a base and a collector;

fifth and sixth current sources;

the input circuit being coupled to the bases of the ninth and tenth transistors;

the ninth and tenth transistors having their collectors coupled to the first power supply connection and their emitters coupled to the bases of the fourth and the third transistors, respectively, and through the fifth and sixth current sources, respectively to the second power supply connection.

18. The improvement of claim 17 wherein the input circuit comprises:

eleventh, twelfth, thirteenth and fourteenth transistors, each having an emitter, a base and a collector;

fourth, fifth, sixth and seventh resistors; and, seventh, eighth, ninth, tenth, eleventh, twelfth and thirteenth current sources;

the eleventh and twelfth transistors having their emitters coupled together and through the seventh current source to the second power supply connection, their bases coupled to form differential inputs to the differential laser driver circuit, and their collectors coupled to the bases of the thirteenth and fourteenth transistors, respectively, to the second power supply connection through the eighth and ninth current sources, respectively, and through the fourth and fifth resistors respectively to the first power supply connection;

the thirteenth and fourteenth transistors having their collectors coupled to the first power supply connection, and their emitters coupled to the second power supply connection through the tenth and the eleventh current sources, and to the bases of the tenth and the ninth transistors, respectively, through the sixth and the seventh resistors, respectively;

the bases of the ninth and tenth transistors being coupled to the second power supply connection through the twelfth and thirteenth current sources, respectively.

19. The improvement of claim 18 wherein the second current source is a eighth resistor.

20. The improvement of claim 19 wherein the twelfth and thirteenth current sources have a temperature dependence maintaining the average voltage of the bases of the third and fourth transistors substantially at the bandgap voltage of the transistors relative to the voltage of the second power supply connection.

21. The improvement of claim 20 wherein the third and fourth current sources have a temperature dependence maintaining the voltage of the emitters of the first and second transistors relative to the voltage of the second power supply connection substantially independent of temperature variations.

22. The improvement of claim 19 wherein some of the current sources are variable to reduce the voltage swing on the bases of the first and second transistors and to reduce the common mode voltage on the bases of the third and fourth transistors.

* * * * *